United States Patent
Chong et al.

(10) Patent No.: US 7,405,131 B2
(45) Date of Patent: Jul. 29, 2008

(54) METHOD AND STRUCTURE TO PREVENT SILICIDE STRAPPING OF SOURCE/DRAIN TO BODY IN SEMICONDUCTOR DEVICES WITH SOURCE/DRAIN STRESSOR

(75) Inventors: Yung Fu Chong, Singapore (SG); Brian Joseph Greene, Yorktown Heights, NY (US)

(73) Assignees: Chartered Semiconductor Manufacturing, Ltd., Singapore (SG); International Business Machines Corporation (IBM), Armonk, NY (US)

( * ) Notice: Subject to any disclaimer, the term of this patent is extended or adjusted under 35 U.S.C. 154(b) by 367 days.

(21) Appl. No.: 11/182,681

(22) Filed: Jul. 16, 2005

(65) Prior Publication Data

US 2007/0020864 A1      Jan. 25, 2007

(51) Int. Cl.
H01L 21/20   (2006.01)
H01L 21/336   (2006.01)

(52) U.S. Cl. .............. 438/300; 438/285; 438/299; 438/303; 438/471; 438/518; 257/E21.193; 257/E21.402; 257/E21.131

(58) Field of Classification Search ............ 438/300, 438/285, 297, 303, 471, 518; 257/E21.431, 257/E21.403, 21, E21.442
See application file for complete search history.

(56) References Cited

U.S. PATENT DOCUMENTS

| | | | |
|---|---|---|---|
| 6,093,593 A | 7/2000 | Jang | |
| 6,531,347 B1 | 3/2003 | Huster | |
| 6,861,318 B2 | 3/2005 | Murthy | |
| 6,881,635 B1 * | 4/2005 | Chidambarrao et al. | 438/300 |
| 7,018,901 B1 * | 3/2006 | Thean et al. | 438/285 |
| 7,268,362 B2 * | 9/2007 | Wang et al. | 257/20 |
| 7,282,415 B2 * | 10/2007 | Zhang et al. | 438/300 |
| 2002/0137295 A1 | 9/2002 | Thei | |
| 2005/0035409 A1 | 2/2005 | Ko | |

* cited by examiner

*Primary Examiner*—Michael S Lebentritt
(74) *Attorney, Agent, or Firm*—Horizon IP Pte Ltd

(57) ABSTRACT

The example embodiments disclose devices and methods to prevent silicide strapping of the Source/Drain to Body in semiconductor devices with S/D stressor. We provide isolation regions in the substrate and a gate structure over the substrate. We form recesses in the substrate adjacent to the gate structure with disposable spacers and adjacent to the isolation regions. We provide stressor regions filling the recesses. The stress region can have a pit adjacent the isolation regions. We form stressor spacers at least partially in the pit on the sidewalls of the stressor regions. We form silicide regions over the stressor regions. The spacer on the stressor regions sidewalls inhibit the formation of silicide at the stressor region edge during the silicide process, thus preventing silicide strapping of the Source/Drain to Body.

26 Claims, 4 Drawing Sheets

METHOD AND STRUCTURE TO PREVENT SILICIDE STRAPPING OF SOURCE/DRAIN TO BODY IN SEMICONDUCTOR DEVICES WITH SOURCE/DRAIN STRESSOR

BACKGROUND OF THE INVENTION

1) Field of the Invention

This invention relates generally to fabrication of semiconductor devices and more particularly to the fabrication of semiconductor devices having reduced silicide strapping of source/drain to body.

2) Description of the Prior Art

It is now well known that strained silicon channels allow higher carrier mobilities, thus improving device performance, and are compatible with mainstream CMOS processing. One emerging technology is the use of SiGe or SiC that is embedded in PFET or NFET devices, respectively, to induce an uniaxial strain in the transistor channel. In a typical process, a recess etch is first performed in the silicon substrate, exposing the STI sidewall. This recess is subsequently filled with epitaxial SiGe or SiC.

The importance of overcoming the various deficiencies is evidenced by the extensive technological development directed to the subject, as documented by the relevant patent and technical literature. The closest and apparently more relevant technical developments in the patent literature can be gleaned by considering the following patents.

U.S. Pat. No. 6,861,318: Semiconductor transistor having a stressed channel—Semiconductor transistor for integrated circuits, comprises source and drain formed in source and drain recesses, respectively, source and/or drain being made of film material, which is formed to have second lattice having second spacing Inventor: Murthy, Anand.

U.S. Pat. No. 6,531,347: Method of making recessed source drains to reduce fringing capacitance—Manufacture of semiconductor device involves forming source and drain regions that are recessed at prescribed depth below semiconductor substrate surface. Inventor: Huster, Carl.

US20050035409A1: Structure and method of a strained channel transistor and a second semiconductor component in an integrated circuit—Inventor: Ko, Chih-Hsin.

U.S. Pat. No. 6,710,413 and US 20020137295A1: Salicide field effect transistors with improved borderless contact structures and a method of fabrication—Salicide FET fabricating method comprises performing thermal annealing on ion-implanted borderless contact openings formed by over-etching deposited dielectric layer. Inventor: Thei, Kong-Beng.

U.S. Pat. No. 6,093,593: Method of forming a gate which provides a reduced corner recess in adjacent shallow trench isolation—Gate formation for semiconductor fabrication has resist protect layer and silicide regions on source and drain. Inventor: Jang, Syun-Ming

SUMMARY OF THE INVENTION

An example embodiment of the present invention provides a structure and a method of manufacturing a device with spacers on active regions that can prevent silicide shorting problems.

An example embodiment of the present invention provides a structure and a method of manufacturing CMOS devices with S/D stressors having reduced silicide strapping of source/drain to body.

An example embodiment provides a method of fabrication of a semiconductor device; comprising the steps of:

providing a gate structure over a substrate;
providing isolation regions spaced from the gate structure;
forming recesses in substrate adjacent to the gate structure and adjacent to the isolation regions;
forming stressor regions by filling the recesses; the stress region have a pit adjacent to the isolation regions; the pit has sidewalls on the stressor region and the isolation regions;
forming stressor spacers on the sidewalls of the stressor regions.

An example embodiment provide a semiconductor device comprising:

a gate structure over a substrate;
isolation regions in the substrate; the isolation regions spaced from the gate structure;
recesses in the substrate adjacent to the gate structure and adjacent to the isolation regions;
stressor regions filling the recesses; the stress region have a pit adjacent to the isolation regions; the pit has sidewalls on the stressor region and the isolation regions;
stressor spacers on the sidewalls of the stressor regions.

The above and below advantages and features are of representative embodiments only, and are not exhaustive and/or exclusive. They are presented only to assist in understanding the invention. It should be understood that they are not representative of all the inventions defined by the claims, to be considered limitations on the invention as defined by the claims, or limitations on equivalents to the claims. For instance, some of these advantages may be mutually contradictory, in that they cannot be simultaneously present in a single embodiment. Similarly, some advantages are applicable to one aspect of the invention, and inapplicable to others. Furthermore, certain aspects of the claimed invention have not been discussed herein. However, no inference should be drawn regarding those discussed herein relative to those not discussed herein other than for purposes of space and reducing repetition. Thus, this summary of features and advantages should not be considered dispositive in determining equivalence. Additional features and advantages of the invention will become apparent in the following description, from the drawings, and from the claims.

BRIEF DESCRIPTION OF THE DRAWINGS

The features and advantages of a semiconductor device according to the present invention and further details of a process of fabricating such a semiconductor device in accordance with the present invention will be more clearly understood from the following description taken in conjunction with the accompanying drawings in which like reference numerals designate similar or corresponding elements, regions and portions and in which.

DETAILED DESCRIPTION OF THE EXAMPLE EMBODIMENTS

A. Example Embodiment Overview

An example embodiment of the present invention discloses a method to prevent silicide strapping of the Source/Drain (source/drain) to Body in semiconductor devices with S/D stressors such as SiGe or SiC. For example, for embedded SiGe (eSiGe) PFET devices, the stressor material is epitaxially grown in the S/D recesses. Following this, the original (disposable) spacers were stripped and reformed, and in the process, sidewall spacers were formed on the edge of the active (or stressor) regions. These sidewall spacers inhibit the formation of silicide at the active edge during the silicidation process and thus prevent silicide strapping of the Source/Drain to Body.

In another example option where the original spacers were intentionally not removed, sidewall stressor spacers can also be formed on the stressor regions by first depositing a conformal dielectric layer over the substrate, followed by an anisotropic etch.

FIGS. 1A to 5 show an example embodiment having pit stressor spacers 48 on the sidewalls of the stressor region 36 that prevent silicide shorting.

B. Gate Structure

Figure 1A:
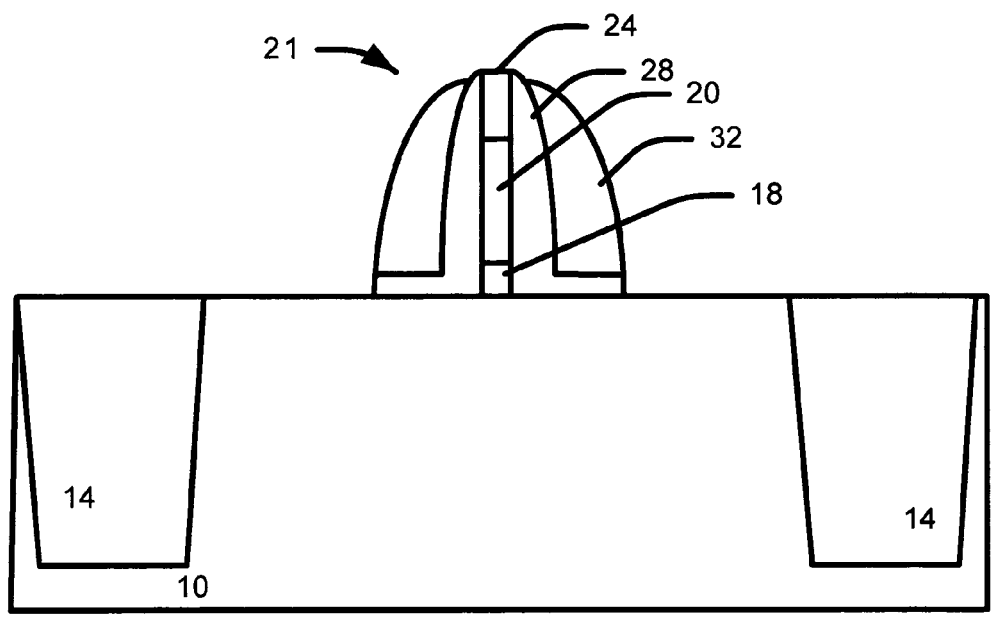
FIGS. 1A, 1B, 1C, 2, 3, 4 and 5 are cross sectional views for illustrating a structure and method for manufacturing a device according to an example embodiment of the present invention.

As shown in FIG. 1A, we provide isolation regions 14 in the substrate 10. The substrate 10 can be comprised of silicon with a (100) or (110) orientation, a silicon on insulator (SOI) substrate, strained silicon or SiGe with varying Ge concentrations.

As shown in FIG. 1A, we provide a gate structure 21 over a substrate 10. The gate structure 21 can be comprised of a gate dielectric layer 18, a gate 20, L-shaped spacers 28 on the sidewalls of the gate dielectric layer 18, gate 20, and over portions of the substrate surface adjacent to the gate 20. A cap layer 24 is provided over the gate 20. Source/drain extension (SDE) or lightly doped drain (LDD) ion implantation can be performed prior to the formation of L-shaped spacers 28 (not shown). Disposable spacers 32 are formed over the L-shaped spacers 28 of the gate structure.

In an example embodiment, the cap layer 24 is comprised of silicon nitride. Disposable spacers 32 are formed over the L-shaped spacers 28. The disposable spacers are preferably made of silicon nitride. The isolation regions 14 are spaced from the L shaped spacers 28.

The gate dielectric layer 18 can be comprised of silicon dioxide (e.g., nitrided by rapid thermal process or plasma process), silicon oxynitride (SiON), or high-k material such as HfO2, HfAlO or HfSiOx.

Gate layer 20 can be comprised of poly-crystalline silicon (polysilicon), or metals such as Ta, TaN, Mo, Ru, Ni, Ti, or alloys of the above metals.

C. Forming Recesses

Figure 1B:
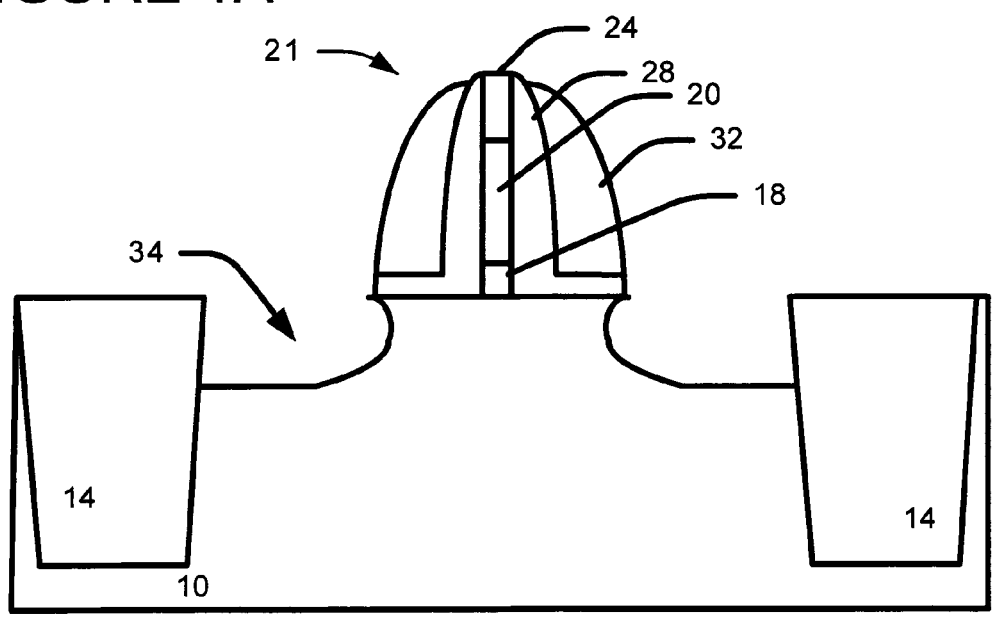

Referring to FIG. 1B, we form recesses 34 in the substrate 10 adjacent to the disposable spacers 32 and adjacent to the isolation regions 14. The recess preferably exposes at least a portion of the isolation sidewalls. The silicon recesses are preferably formed by a selective etch process using the gate structure and the isolation regions 14 as etch masks. The selective etch process can be an anisotropic, isotropic, or a combination of anisotropic and isotropic etch processes. In this example embodiment (FIG. 1B), the silicon recess is formed by an isotropic etch process, hence there is some undercutting beneath the horizontal portion of the L-shaped spacers 28. The vertical depth of the recess 34 can be between 20 and 150 nm.

Figure 1C:
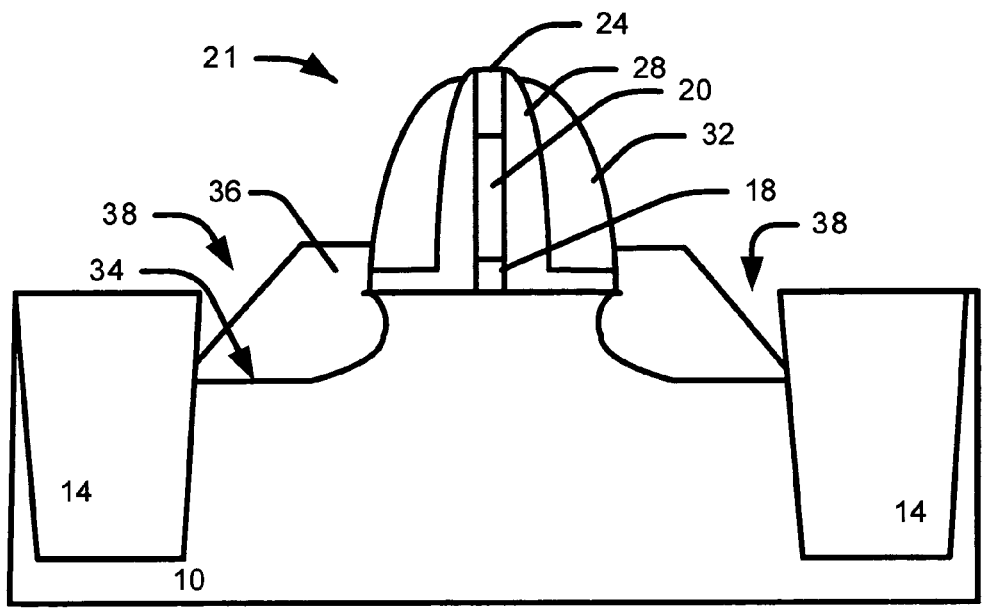

D. Providings Stressor Regions Having a Pit (Small Hole) Adjacent to the Isolation Regions As shown in FIG. 1C, we form stressor regions 36 filling the recesses 34. The stressor regions preferably put a stress on the channel region of the device. The stressor regions can have a pit 38 (e.g., small hole or depression) adjacent to the isolation regions 14. The pit has sidewalls on the stressor region 36 and the isolation regions 14. The pit 38 is caused by reduced (e.g., faceted) growth of stressor material occurring along the STI bounded edges of the source and drain regions. The growth is reduced (e.g., faceted) because there is no silicon to grow from at the (e.g., oxide) STI edge. Hence, growth is primarily in the vertical direction (from the bottom of the recess) and limited growth occurs from the lateral direction.

The pit 38 can have a depth between 0 and 20 nm and a top width between 0 and 20 nm. Zero depth and zero width means that the STI (or isolation) regions are at the same level as the bottom of the recess.

The stressor regions 36 can be formed using an epitaxial process. The stressor regions 36 are preferably comprised of $Si_{(1-x)}Ge_x$, $Si_{(1-x)}C_x$ or $S_{(1-x-y)}B_xGe_y$, where x is between 0.1 and 0.8, and y is between 0.1 and 0.8, and are most preferably comprised of $Si_{(1-x)}Ge_x$. The $Si_{(1-x)}Ge_x$ can be undoped or in-situ doped with boron. The $Si_{(1-x)}C_x$ can be undoped or in-situ doped with phosphorous. The thickness of the epitaxial stressor 36 is between 20 and 180 nm. Raised S/D regions are formed when the thickness of the epitaxial stressor is greater than the recess depth.

E. Forming Stressor Spacers on the Sidewalls of the Stressor Regions

In a key step, we form stressor spacers on the sidewalls of the stressor regions in the pit.

Figure 2:
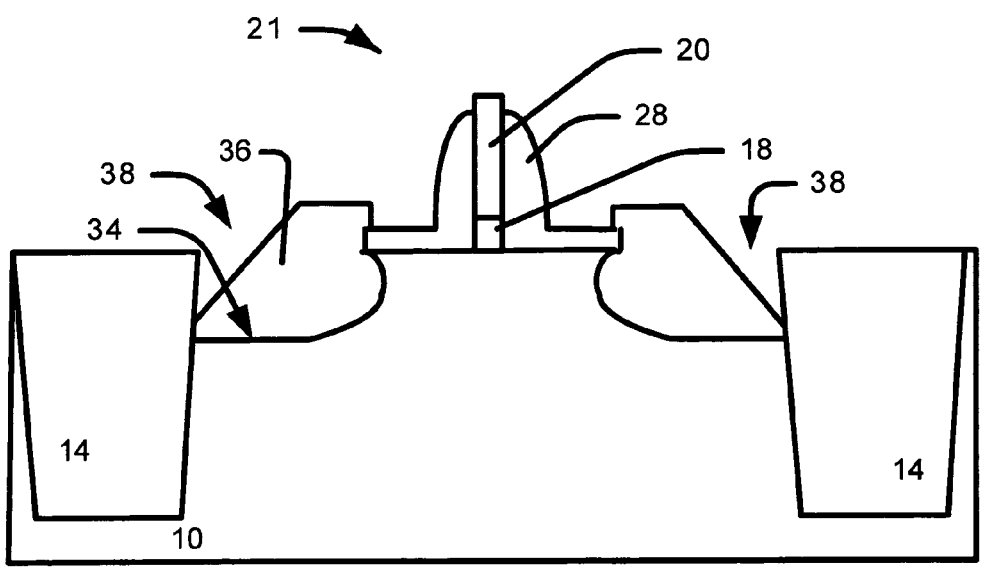
Figure 3:
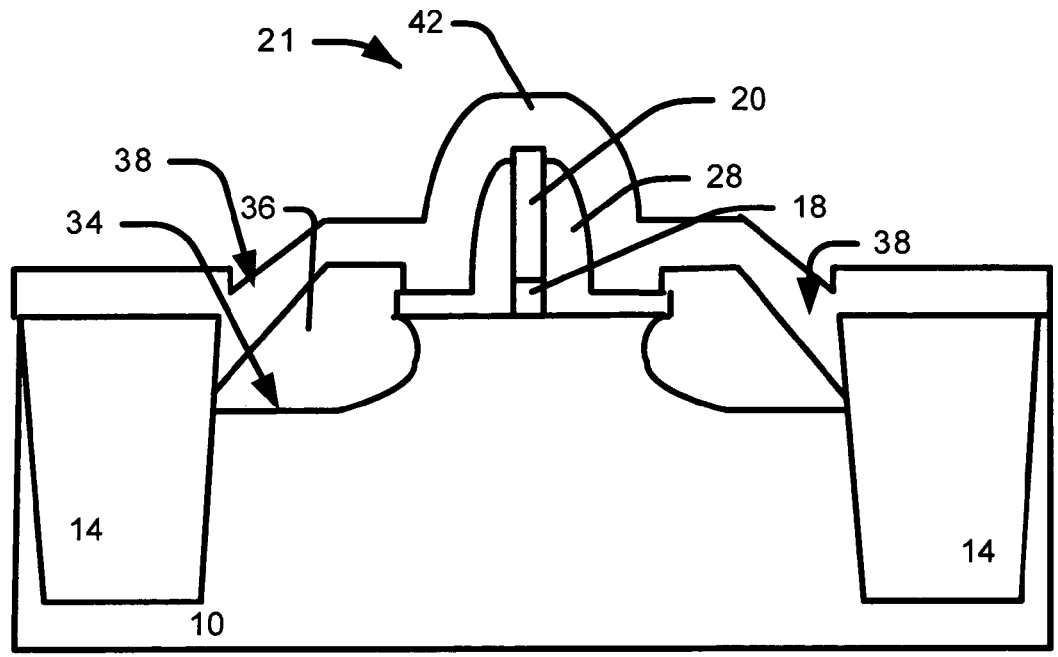
Figure 4:
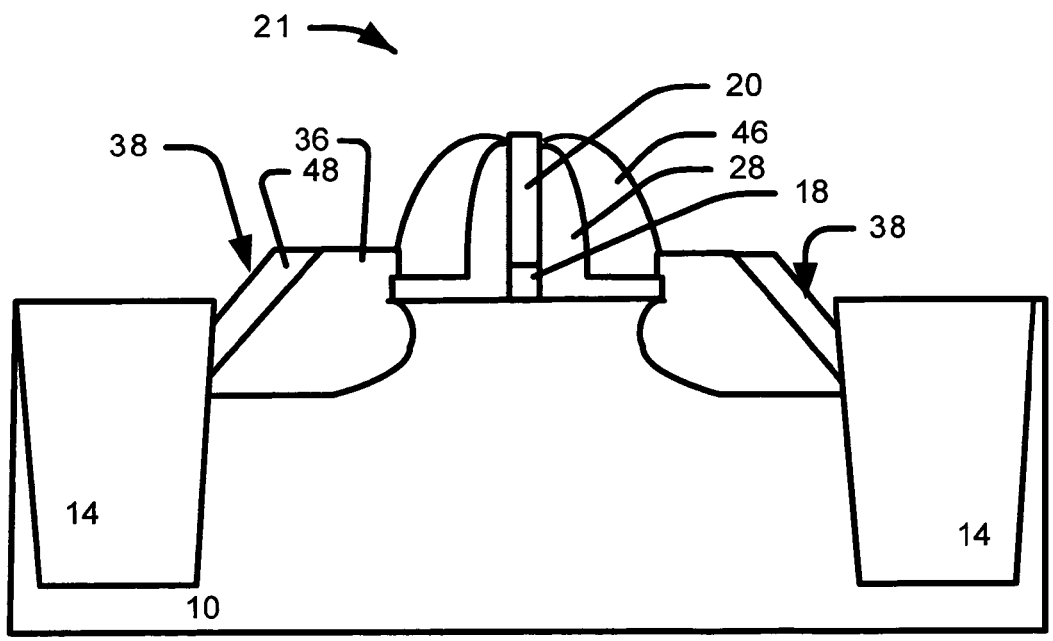

FIGS. 2 to 4 show an example method to form the stressor spacers.

As shown in FIG. 2, we can remove the cap layer 24 and disposable spacers 32 using a wet etch. It is preferred that hot phosphoric acid is used for this wet etch step.

Referring to FIG. 3, we deposit a dielectric layer 42 over the substrate surface, the gate structure 21, the pit 38, and the stressor regions 36. The dielectric layer can be comprised of silicon nitride, or tetraethyl orthosilicate (TEOS) oxide and more preferably silicon nitride. The dielectric layer can be conformal.

Referring to FIG. 4, we anisotropically etch the dielectric layer 42 to form stressor spacers 48 on the sidewalls of the stressor regions 36 in the pit 38 and preferably not on the sidewalls of the isolation region 14. This also forms second spacers 46 on the L-shaped spacers 28. Preferable, spacers are not formed on the STI sidewalls, instead, stressor spacers 48 are formed on the sidewalls of the stressor regions 36. This is possible because the anisotropic etch is a highly directional RIE process, thus the etch rate in the direction normal to the surface is much higher than in direction parallel to the surface.

The stressor spacers 48 are preferably comprised of silicon nitride or tetraethyl orthosilicate (TEOS) oxide and more preferably of nitride.

The stressor spacer 48 on the stressor regions sidewalls inhibit the formation of silicide at the edge of the stressor regions 36 during the subsequent silicidation process, thus preventing silicide strapping of the Source/Drain to Body.

In another example option where the original spacers 32 were not intentionally removed, sidewall stressor spacers 48 can also be formed on the stressor regions 36 by first depositing a conformal dielectric layer (e.g., 42) over the substrate, followed by an anisotropic etch.

F. Forming Silicide

As stated above, the source/drain extension (SDE) or lightly doped drain (LDD) ion implantation is preferably performed prior to the formation of L-shaped spacers 28 (not shown).

As stated above, the stressor regions 36 can be undoped or in-situ doped with boron (for PFET) or phosphorous (for NFET).

In the case where the stressor regions 36 are undoped during the epitaxial growth, we perform ion implantation into the S/D regions.

Figure 5:
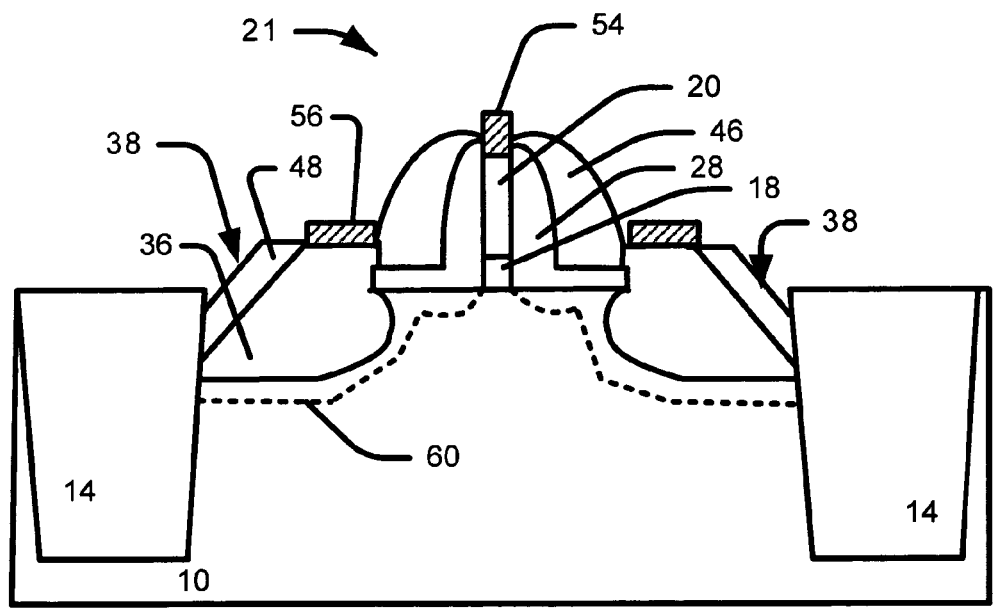

To complete the device fabrication, a thermal anneal process is carried out to activate the SDE and S/D regions. Preferably we use a RTA process with a temperature between 900 and 1300 degrees C. for a duration between 500 microsec and 5 sec. The final S/D junctions including the SDE regions 60 are shown in FIG. 5.

To form silicide, we can first deposit a metal layer (e.g., essentially Ni, Pt, NiPt, NiPd or Co, or combinations thereof) and most preferably Ni over the substrate surface. Then, we anneal the substrate 10 to convert the metal to metal-silicides (e.g. NiPtSiGe). We remove the unreacted metal layer with a selective metal etch process (preferably wet etch). After this step, an optional heat treatment is performed to form metal-silicides of desired sheet resistance. Silicide layer 54 is formed over gate 20, and silicide layer 56 is formed over stressor regions 36.

During the silicidation process, the pit spacers 48 do not allow the metal to react with the stressor material at the edge of the stressor regions 36 adjacent to the isolation regions 14. Hence, the pit spacers (stressor spacers) 48 prevent silicide from shorting the S/D and body.

G. Example of Source/drain to Body Strapping

Figure 6:
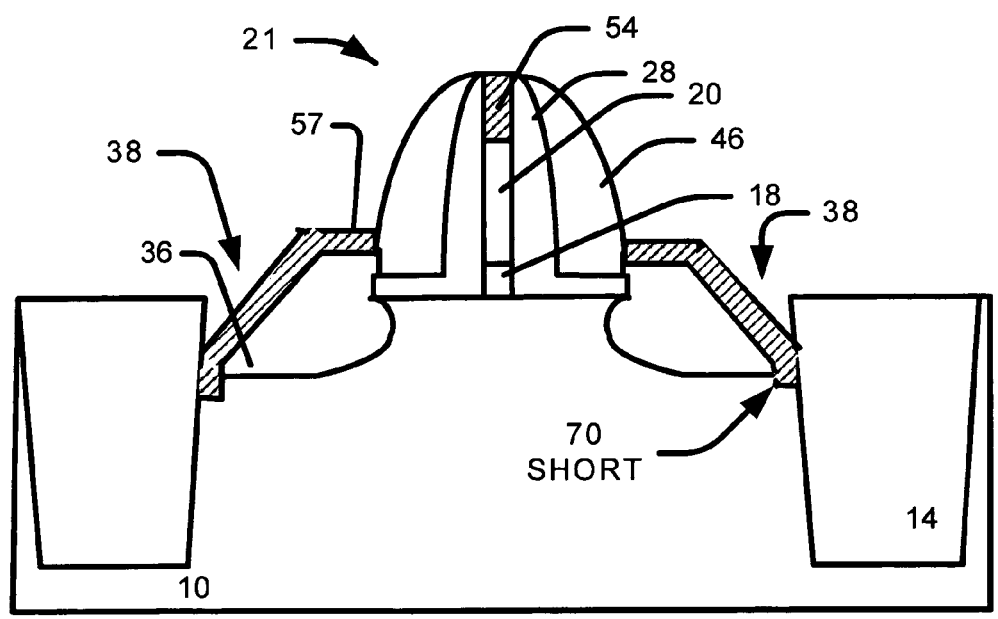
FIG. 6 is a cross sectional views for illustrating an example of a device that has source/drain to body strapping (shorting).

FIG. 6 shows an example of a device that has source/drain to body strapping (shorting). As shown in FIG. 6, the silicide (source/drain body strap) over the raised S/D region form shorts 70 to the substrate (body) along the edge of the STI 14.

In a typical strained channel embedded FET process, a recess etch is first performed in the silicon substrate, exposing the shallow trench isolation (STI) sidewall. This recess is subsequently partially filled with epitaxial SiGe or SiC. However, the epitaxial SiX layer does not grow on the oxide STI sidewalls and a pit is formed. The reduced growth at the STI boundaries is undesirable because during silicidation, the siliciding metal is in close proximity to the source/drain junction edge. Hence there is an increased risk of source/drain to body strapping with such a structure. When source/drain to body strap extends beyond the S/D junction, junction spiking occurs and the S/D and body will be shorted. This will lead to device failure.

H. Non-limiting Example Embodiments

In the above description numerous specific details are set forth such as flow rates, pressure settings, thicknesses, etc., in order to provide a more thorough understanding of the present invention. Those skilled in the art will realize that power settings, residence times, gas flow rates are equipment specific and will vary from one brand of equipment to another. It will be obvious, however, to one skilled in the art that the present invention may be practiced without these details. In other instances, well known process have not been described in detail in order to not unnecessarily obscure the present invention.

Although this invention has been described relative to specific insulating materials, conductive materials and apparatuses for depositing and etching these materials, it is not limited to the specific materials or apparatuses but only to their specific characteristics, such as conformal and nonconformal, and capabilities, such as depositing and etching, and other materials and apparatus can be substituted as is well understood by those skilled in the microelectronics arts after appreciating the present invention Unless explicitly stated otherwise, each numerical value and range should be interpreted as being approximate as if the word about or approximately preceded the value of the value or range.

Given the variety of embodiments of the present invention just described, the above description and illustrations show not be taken as limiting the scope of the present invention defined by the claims.

While the invention has been particularly shown and described with reference to the preferred embodiments thereof, it will be understood by those skilled in the art that various changes in form and details may be made without departing from the spirit and scope of the invention. It is intended to cover various modifications and similar arrangements and procedures, and the scope of the appended claims therefore should be accorded the broadest interpretation so as to encompass all such modifications and similar arrangements and procedures.

What is claimed is:

1. A method for forming an integrated circuit comprising:
   providing a substrate prepared with isolation regions and a gate of a transistor on a device region within the isolation regions;
   recessing the substrate in regions adjacent to the gate and isolation regions to create recesses;
   forming stressors in the recesses, the stressors induce a stress in a channel region beneath the gate, wherein a stressor comprises a top surface having a horizontal portion and a sloping portion relative to a top surface of the substrate, with the horizontal portion located adjacent to the gate and the sloping portion located adjacent to the isolation region; and
   forming dielectric stressor spacers on the sloping portions of the stressors, wherein the dielectric stressor spacers reduce silicide strapping of the source and drain to body.

2. The method of claim 1 wherein the stressors comprises silicon formed by epitaxial growth, including SiGe, SiC and SiBGe.

3. The method of claim 1 wherein forming the stressors results in forming pits between the sloping portions of the stressors and isolation regions.

4. The method of claim 3 wherein the stressors comprises silicon formed by epitaxial growth, including SiGe, SiC and SiBGe.

5. The method of claim 1 further comprises:
   forming source and drain of the transistor in the stressors; and
   forming silicide contacts on surfaces of the stressors unprotected by the dielectric stressor spacers.

6. The method of claim 5 wherein the stressors comprises silicon formed by epitaxial growth, including SiGe, SiC and SiBGe.

7. The method of claim 5 wherein forming the stressors results in forming pits between the sloping portions of the stressors and isolation regions.

8. The method of claim 7 wherein the stressors comprises silicon formed by epitaxial growth, including SiGe, SiC and SiBGe.

9. The method of claim 1 wherein:
the gate includes L-shaped gate sidewall spacers and sacrificial spacers over the gate sidewall spacers; and
forming dielectric stressor spacers comprises
removing the sacrificial spacers,
depositing a dielectric layer on the substrate, and
anisotropically etching the dielectric layer to form the dielectric stressor spacers.

10. The method of claim 9 further comprises:
forming source and drain of the transistor in the stressors; and
forming silicide contacts on surfaces of the stressors unprotected by dielectric stressor spacers.

11. The method of claim 10 wherein the stressors comprises silicon formed by epitaxial growth, including SiGe, SiC and SiBGe.

12. The method of claim 10 wherein forming the stressors results in forming pits between the sloping portions of the stressors and isolation regions.

13. The method of claim 12 wherein the stressors comprises silicon formed by epitaxial growth, including SiGe, SiC and SiBGe.

14. A method for forming a semiconductor device comprising:
providing a substrate prepared with an isolation region adjacent to a device region with a device feature thereon;
forming a recess in the device region between the isolation region and device feature;
forming a stressor in the recess, the stressor induces a stress in the substrate under the device feature, wherein the stressor comprises a top surface having a horizontal portion and a sloping portion relative to a top surface of the substrate, the horizontal surface is located adjacent to the device feature and the sloping portion is located adjacent to the isolation region; and
forming a dielectric stressor spacer on the sloping portion of the stressor.

15. The method of claim 14 wherein forming the stressor results in forming a pit between the sloping portion of the stressor and isolation region.

16. The method of claim 15 wherein the stressor comprises silicon formed by epitaxial growth, including SiGe, SiC and SiBGe.

17. The method of claim 14 wherein the device feature comprises a gate of a transistor and further comprises:
forming first and second recesses adjacent to the gate and the isolation region; and
forming first and second stressors in the first and second recesses;
forming first and second dielectric stressor spacers on the sloping portions of the first and second stressors; and
forming source and drain of the transistor in the stressors.

18. The method of claim 17 wherein the gate includes L-shaped gate sidewall spacers and sacrificial spacers over the gate sidewall spacers, and:
wherein forming the dielectric stressor spacers comprises
removing the sacrificial spacers,
depositing a dielectric layer on the substrate, and
anisotropically etching the dielectric layer to form the dielectric stressor spacers; and
further comprises forming silicide contacts on surfaces of stressors unprotected by the dielectric stressor spacers.

19. The method of claim 17 wherein forming the stressors results in forming pits between the sloping portions of the stressors and isolation regions.

20. The method of claim 19 wherein the gate includes L-shaped gate sidewall spacers and sacrificial spacers over the gate sidewall spacers, and:
wherein forming the dielectric stressor spacers comprises
removing the sacrificial spacers,
depositing a dielectric layer on the substrate, and
anisotropically etching the dielectric layer to form the stressor spacers; and
further comprises forming silicide contacts on surfaces of stressors unprotected by the dielectric stressor spacers.

21. A method of forming a transistor comprising:
providing a substrate with a device region defined thereon, wherein the substrate is prepared with isolation regions surrounding the device region and a gate on the device region;
etching the substrate to form first and second recesses in the substrate adjacent to the gate and isolation regions;
forming stressors in the recesses, wherein a stressor comprises a top surface having horizontal and sloping surface portions, the horizontal surface portion is located adjacent to the gate and the sloping surface portion is located adjacent to the isolation region; and
forming dielectric stressor spacers on the sloping surface portions of the stressors.

22. The method of claim 21 wherein:
the gate includes L-shaped gate sidewall spacers and sacrificial spacers over the gate sidewall spacers; and
forming the dielectric stressor spacers comprises
removing the sacrificial spacers,
depositing a dielectric layer on the substrate, and
anisotropically etching the dielectric layer to form the dielectric stressor spacers.

23. The method of claim 22 further comprises:
forming source and drain of the transistor in the stressors; and
forming silicide contacts on surfaces of the stressors unprotected by the dielectric stressor spacers.

24. The method of claim 21 wherein forming the stressors results in forming a pit between the sloping surface portions of the stressors and isolation regions.

25. The method of claim 24 wherein:
the gate includes L-shaped gate sidewall spacers and sacrificial spacers over the gate sidewall spacers; and
forming the dielectric stressor spacers comprises
removing the sacrificial spacers,
depositing a dielectric layer on the substrate, and
anisotropically etching the dielectric layer to form the dielectric stressor spacers.

26. The method of claim 25 further comprises:
forming source and drain of the transistor in the stressors; and
forming silicide contacts on surfaces of stressors unprotected by dielectric stressor spacers.

* * * * *